US012683566B2

(12) United States Patent　　(10) Patent No.:　US 12,683,566 B2

Cosentino　　(45) Date of Patent:　　Jul. 14, 2026

(54) CIRCUIT HAVING AN AMPLIFIER STAGE AND A CURRENT MIRROR LOOP OR STABILITY NETWORK

(71) Applicant: STMicroelectronics S.r.l., Agrate Brianza (IT)

(72) Inventor: Gaetano Cosentino, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 562 days.

(21) Appl. No.: 18/303,931

(22) Filed: Apr. 20, 2023

(65) Prior Publication Data

US 2023/0361737 A1　　Nov. 9, 2023

(30) Foreign Application Priority Data

May 6, 2022　(IT) ......................... 102022000009332

(51) Int. Cl.
　H03F 3/45　　(2006.01)
　H03F 1/08　　(2006.01)
　H03F 1/48　　(2006.01)
(52) U.S. Cl.
　CPC ......... *H03F 3/45475* (2013.01); *H03F 1/086* (2013.01); *H03F 1/483* (2013.01);
　　　　　　(Continued)
(58) Field of Classification Search
　CPC ...... H03F 3/45475; H03F 1/086; H03F 1/483; H03F 3/45273; H03F 3/195; H03F 2200/294; H03F 2200/451; H03F 2203/30084; H03F 2203/30117; H03F 2203/45591; H03F 1/308; H03F 3/3022; H03F 3/3061; H03F 3/45179; H03F 3/45632; H03F 2203/45522; H03G 3/30

(Continued)

(56) References Cited

U.S. PATENT DOCUMENTS 5,568,093 A * 10/1996 Holzer ................... H03K 5/023
　　　　　　　　　　　　　　　330/264
6,489,847 B1 * 12/2002 van Zeijl .............. H03F 3/3001
　　　　　　　　　　　　　　　330/257

(Continued)

FOREIGN PATENT DOCUMENTS

IT　　202000004159 A1　　8/2021
WO　　2005086957 A2　　9/2005

*Primary Examiner* — Khanh V Nguyen
(74) *Attorney, Agent, or Firm* — Slater Matsil, LLP

(57)　　　　ABSTRACT

A circuit an amplifier stage that amplifier stage includes a positive amplifier branch and a negative amplifier branch and has current flow paths therethrough cascaded in a flow line for a core current for the amplifier stage between a supply node and a ground node. The positive and negative amplifier branches have respective input nodes configured to receive an input signal applied therebetween. A current mirror loop can be coupled to the respective input nodes of the positive and negative amplifier branches and provides an adjustable high-impedance bias source for the core current for the amplifier stage. In addition to, or instead of the current mirror loop, the circuit can include stability network having a gain bandwidth range. The amplifier stage is configured to short-circuit the output signal from the amplifier stage within the gain bandwidth range based on an output voltage setting signal.

20 Claims, 5 Drawing Sheets

(52) U.S. Cl.
CPC ..... *H03F 3/45273* (2013.01); *H03F 3/45174* (2013.01); *H03F 3/45179* (2013.01)

(58) Field of Classification Search
USPC ................................................. 330/252–269
See application file for complete search history.

(56) References Cited

U.S. PATENT DOCUMENTS

| | | | | |
|---|---|---|---|---|
| 8,497,736 B1 * | 7/2013 | Leipold | ................ | H03F 3/3022 |
| | | | | 330/267 |
| 2009/0140812 A1 | 6/2009 | Deng et al. | | |
| 2009/0251217 A1 * | 10/2009 | Keerti | ....................... | H03F 3/72 |
| | | | | 330/264 |
| 2018/0152142 A1 * | 5/2018 | Ayraud | ................ | H03F 1/0205 |
| 2021/0271281 A1 | 9/2021 | Baorda et al. | | |

* cited by examiner

- PRIOR ART -

CIRCUIT HAVING AN AMPLIFIER STAGE AND A CURRENT MIRROR LOOP OR STABILITY NETWORK

CROSS-REFERENCE TO RELATED APPLICATIONS

This application claims the priority benefit of Italian patent application number 102022000009332, filed on Jun. 5, 2022, which is hereby incorporated by reference to the maximum extent allowable bylaw.

TECHNICAL FIELD

The disclosure describes a circuit having an amplifier stage and a current mirror loop or stability network.

BACKGROUND

Low-noise amplifiers, LNAs configured to operate as variable-gain amplifiers (VGAs) in the radio frequency (RF) range can be supplied with medium voltages (e.g., 1.8 to 2.5 V) with a non-negligible power consumption.

This may be the case of amplifiers operating at wavelengths of the order of 65 nm and including plural stages (e.g., two stages).

The capability of providing several RF VGA gain steps of, e.g., 1 dB each over a sufficiently broad gain range (for instance, at least 30 dB from −10 dB to +20 dB with an input power from −97.5 dBm up to +4 dBm) is a desirable feature for such amplifiers.

Applicability with low-voltage (1.1 V, for instance) nanometer technology would be likewise desirable.

SUMMARY

The description relates to amplifier circuits for use in, for example, variable-gain amplifiers (VGAs). Solutions according to the description can be used, for instance, in the automotive sector. Satellite radio and online radio services are possible exemplary areas of interest.

One or more embodiments can contribute in addressing adequately the issues discussed in the foregoing section.

One or more embodiments may relate to a corresponding variable-gain amplifier (VGA) and one or more embodiments may relate to a corresponding device (e.g., a satellite radio receiver). One or more embodiments may relate to a corresponding method.

Solutions as exemplified herein facilitates providing a single-stage low-noise amplifier, e.g., an RF VGA.

Solutions as described herein facilitate providing high-linearity, low-noise amplifiers exhibiting a high power supply rejection ratio, PSRR suitable to provide wide gain range variations without introducing a stability network function for a specific gain setting.

Solutions as described herein facilitate providing RF VGAs (possibly in the form of Intellectual Property cores or IPs) operable with small gain steps (e.g., 30 steps of 1 dB gain each) associated with high linearity and low noise figure, NF specifications.

Solutions as described herein are suited for implementation with low-voltage, high-performance advanced CMOS technology.

Solutions as described herein provide high-linearity, low-noise figure, low-voltage supply, and wide gain range (including attenuation) without stability drawbacks in comparison with conventional solutions.

Solutions as described herein can be implemented both in a single-ended and in a differential layout.

Solutions as described herein facilitate high-level integration.

Also, using an auxiliary high-impedance buffer facilitates a boost of the maximum available gain in various embodiments.

Solutions as described herein are substantially exempt from oscillation and unwanted spurious signals over the whole gain range and expected temperature range of the amplifier. Such features facilitate use in the automotive sector, e.g., in switching regulators without specific external filtering and decoupling.

BRIEF DESCRIPTION OF THE DRAWINGS

One or more embodiments will now be described, by way of example only, with reference to the annexed figures, wherein.

Corresponding numerals and symbols in the different figures generally refer to corresponding parts unless otherwise indicated.

The figures are drawn to clearly illustrate the relevant aspects of the embodiments and are not necessarily drawn to scale. The edges of features drawn in the figures do not necessarily indicate the termination of the extent of the feature.

Also, throughout this description, a same designation may be used for brevity to designate both a certain node or line (e.g., VSUPPLY) and a signal occurring at that node or line, and both a certain component (e.g., a capacitor or a resistor) and an electrical parameter thereof (e.g., capacitance or resistance/impedance).

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
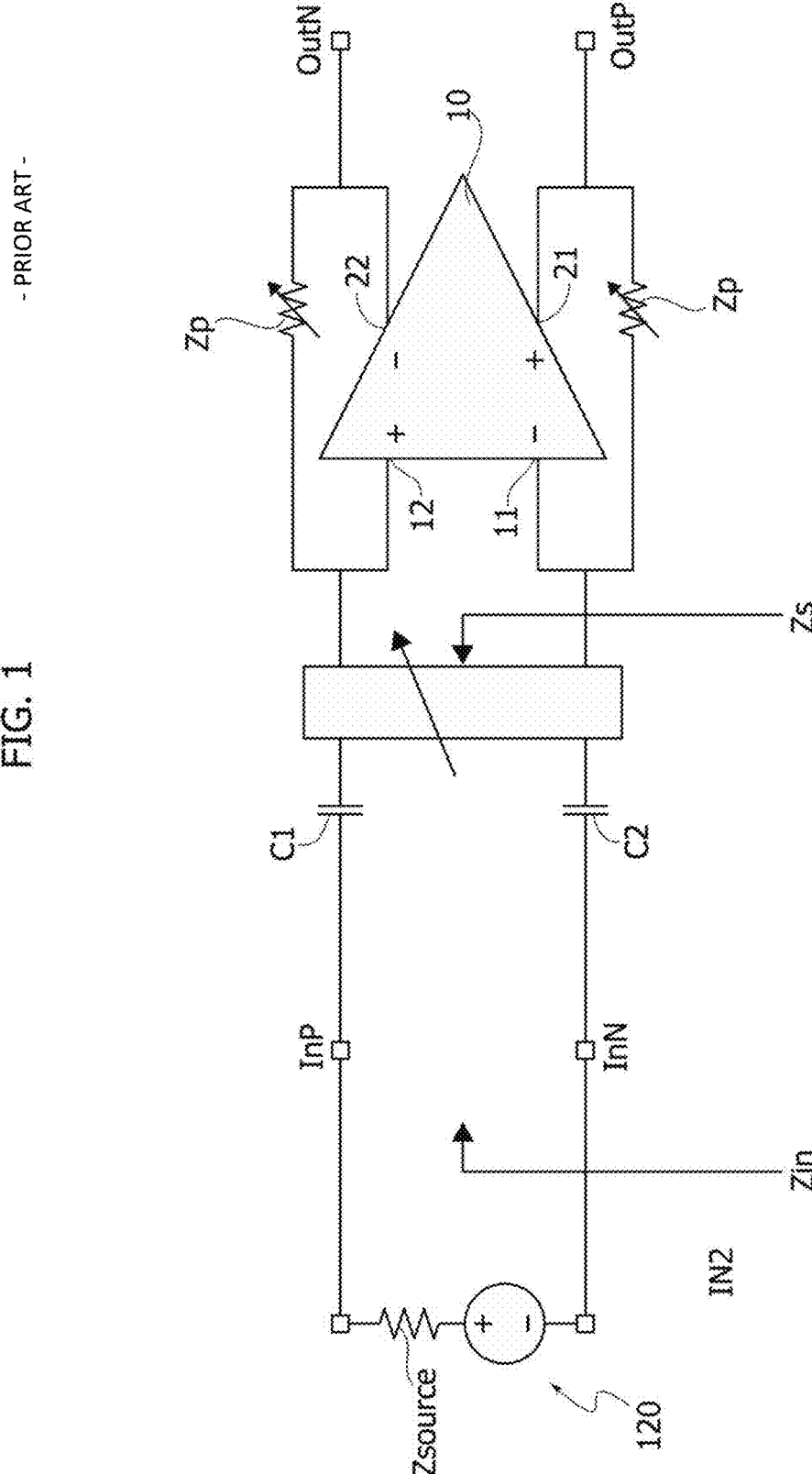
FIG. 1 is a circuit diagram of a conventional variable-gain amplifier (VGA)

FIG. 1 is a circuit diagram exemplary of conventional architecture of a radiofrequency, RF variable-gain amplifier, VGA based on a differential stage 10 (an operational amplifier or op-amp, for instance).

The conventional VGA illustrated in FIG. 1 adopts a differential layout, based on a fully differential amplifier 10 having a differential input 11, 12 and a differential output 21, 22.

In FIG. 1, reference 120 denotes a source of radio frequency signal, RF signal having an associated source impedance Zsource.

The signal source 120 usually represents (this applies both to the conventional arrangement of FIG. 1 and to solutions according to embodiments of the present description as illustrated in FIGS. 2 to 5) a distinct element from the amplifier architecture and thus may not be a part of the embodiments.

In the conventional arrangement illustrated in FIG. 1, the amplifier 10 has a first (inverting) input 11 and a second (non-inverting) input 12 as well as two outputs 21 and 22 configured to provide a (differential) output signal between output nodes OutP and OutN.

In the conventional arrangement of FIG. 1, two variable-impedance (essentially symmetrical) feedback networks are coupled to the amplifier 10. Each feedback network includes a first branch Zp between one of the output nodes OutP, OutN and a respective one of the input nodes 11 and 12 of the amplifier 10, and a second branch Zs coupled (e.g., via an intermediate capacitor C1, C2) between one of the input nodes 11, 12 of the amplifier 10 and a respective input node InP, InN to the amplifier architecture.

In FIG. 1, Zin indicates the input impedance "seen" by the source 120.

A conventional VGA as illustrated in FIG. 1 may likewise adopt a single-ended (non-differential layout) having a single input node and a single output node. In that case, the feedback network will include a single branch Zp from the (single) output to the (single) input of the amplifier 10 and a single branch Zs to apply the input signal from the source 102 to the (single) input of the amplifier 10.

Correspondingly, in FIGS. 2 to 5 (to be discussed in the following) embodiments of the present description are discussed by referring to a single-ended architecture in FIGS. 2 and 3 and a differential architecture in FIGS. 4 and 5.

Returning back to FIG. 1, each of the branches Zp, Zs illustrated therein has a selectively variable impedance: for instance, each of the branches Zp, Zs comprises the parallel connection of a plurality of lines that can be selectively activated (that is, made selectively conductive) and having respective impedances.

For instance, these lines arranged in parallel (not visible in FIG. 1 for simplicity) can comprise the series connection of a resistor and a capacitor plus an electronic switch.

A simplified expression for the gain of an architecture as illustrated in FIG. 1 is $$RF\_VGA\ Gain = -(Zp/(Zs + Zsource))$$

where the impedance Zs can be seen as a series impedance between the impedance Zsource and the amplifier 10. In operation, Zs adds to Zsource, thus determining a desired gain (attenuation), while simultaneously providing an impedance increase to compensate a reduction in the impedance Zp.

The input impedance Zin to the architecture (between the nodes InP and InN) is given by the combination of the series impedance introduced by the branches Zs and the parallel impedance given by the branches Zp selected for a specific gain.

Varying the impedances of the branches Zp and Zs may thus facilitate varying the gain RF_VGA Gain.

For instance, varying the impedances of the branches Zp and Zs may involve turning selectively "on" (conductive) and "off" (non-conductive) the respective switches associated with the parallel lines included in the branches Zp and Zs, thus varying the number of the lines (essentially RC filters) connected in parallel in the branches Zs, Zp.

A corresponding automatic gain control, AGC gain range can be set defining (for instance via a serial peripheral interface, SPI not visible for simplicity) setting a corresponding word RF_Gain_SeL word to determine maximum and minimum values for the gain range.

It is noted that the value for Zp in the (simplified) gain equation decreases once the RF VGA gain index is reduced step-by-step. To that effect, some series resistance may be added to achieve an adequate input matching over the whole gain range.

For instance, architecture as exemplified in FIG. 1 may operate over a gain range between a minimum gain value −10 dB (Word 0) to a maximum gain value of +21 dB (Word 31).

It is noted that—as conventional in the art—the designation "gain" also encompasses negative gain values (dB), namely operation as an attenuator.

Structure and operation of architecture as exemplified in FIG. 1 is otherwise conventional in the art, which makes it unnecessary to provide a more detailed description herein.

As discussed in the introductory portion of this description, conventional low-noise RF VGA architectures as exemplified in FIG. 1 may require increased supply voltages (above the range of 1.8 to 2.5 V), e.g., due to the use of a two-stage amplifier.

It is likewise noted that inductor-based medium-voltage LNA/RF VGA amplifiers can be used in the GHz range, e.g., using high voltages. This facilitates obtaining a high linearity with the non-negligible drawback of increasing power consumption.

High power consumption (possibly related to the presence of two gain stages) and unavailability of low-voltage products are factors militating against developing radio generators having an embedded baseband stage operating at a low voltage to provide a complete receiver (tuner plus baseband stage) with reduced power absorption.

In principle, one could also consider using inverter-based amplifier topologies: this however may turn out to be critical at high frequencies (above 1 GHz) and would also require a specific RC network configuration for each gain setting.

These issues are addressed by architecture as illustrated (in various possible implementations) in FIGS. 2 to 5.

Unless the context indicates otherwise, throughout FIGS. 2 to 5, parts or elements like parts or elements already discussed in connection with FIG. 1 are indicated with like reference symbols, and a corresponding description will not be repeated for brevity. The same also applies to like parts or elements that appear in plural ones of FIGS. 2 to 5.

It is otherwise noted that FIGS. 2 to 5 essentially refer to possible implementations of a gain stage suited to be used as the amplifier stage 10 (with differential or single-ended layout) in variable-gain architecture as exemplified in FIG. 1. This architecture comprises variable-impedance branches Zp, Zs whose impedance can be controllably varied to vary the gain RF_VGA Gain by jointly varying the impedance of the feedback signal branch or branches Zp from the output to the input of the amplifier 100, and the impedance of the input signal path or paths through the further variable-impedance feedback branch or branches Zs.

Solutions as discussed herein in connection with FIGS. 2 to 5, essentially address issues related to the amplifier core, as represented by the amplifier 10 in the conventional arrangement of FIG. 1.

The variable-impedance branches Zp, Zs (and other associated components) are not explicitly illustrated in FIGS. 2 to 5 in order to avoid making the representation unduly cumbersome. Also, in FIGS. 2 to 5, the input source 120 is represented highlighting its connection to input nodes such as 101 merely by way of reference without representing the input branch(es) Zs.

Figure 2:
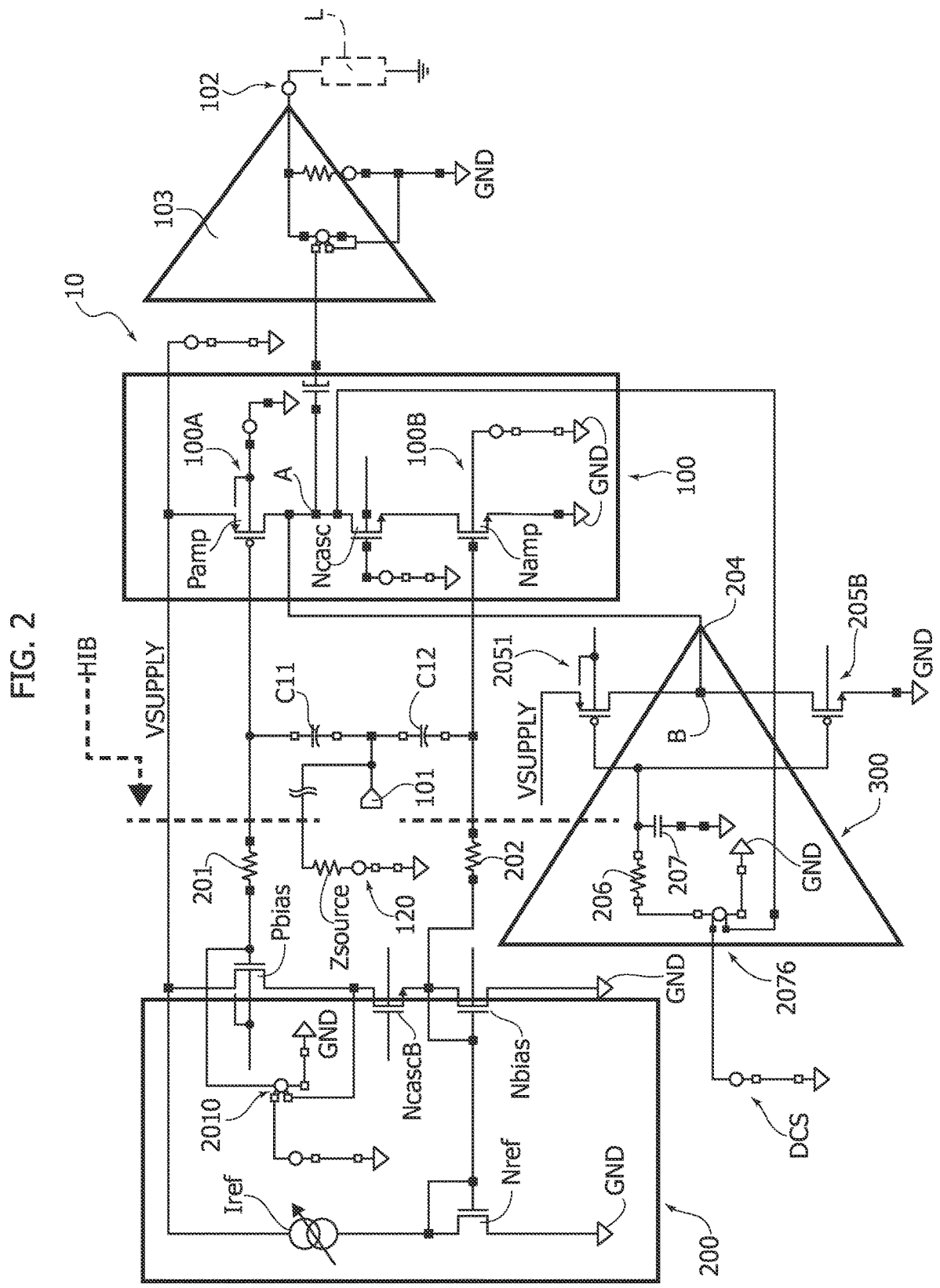
FIG. 2 illustrates a circuit according to a first embodiment of the present description.
Figure 3:
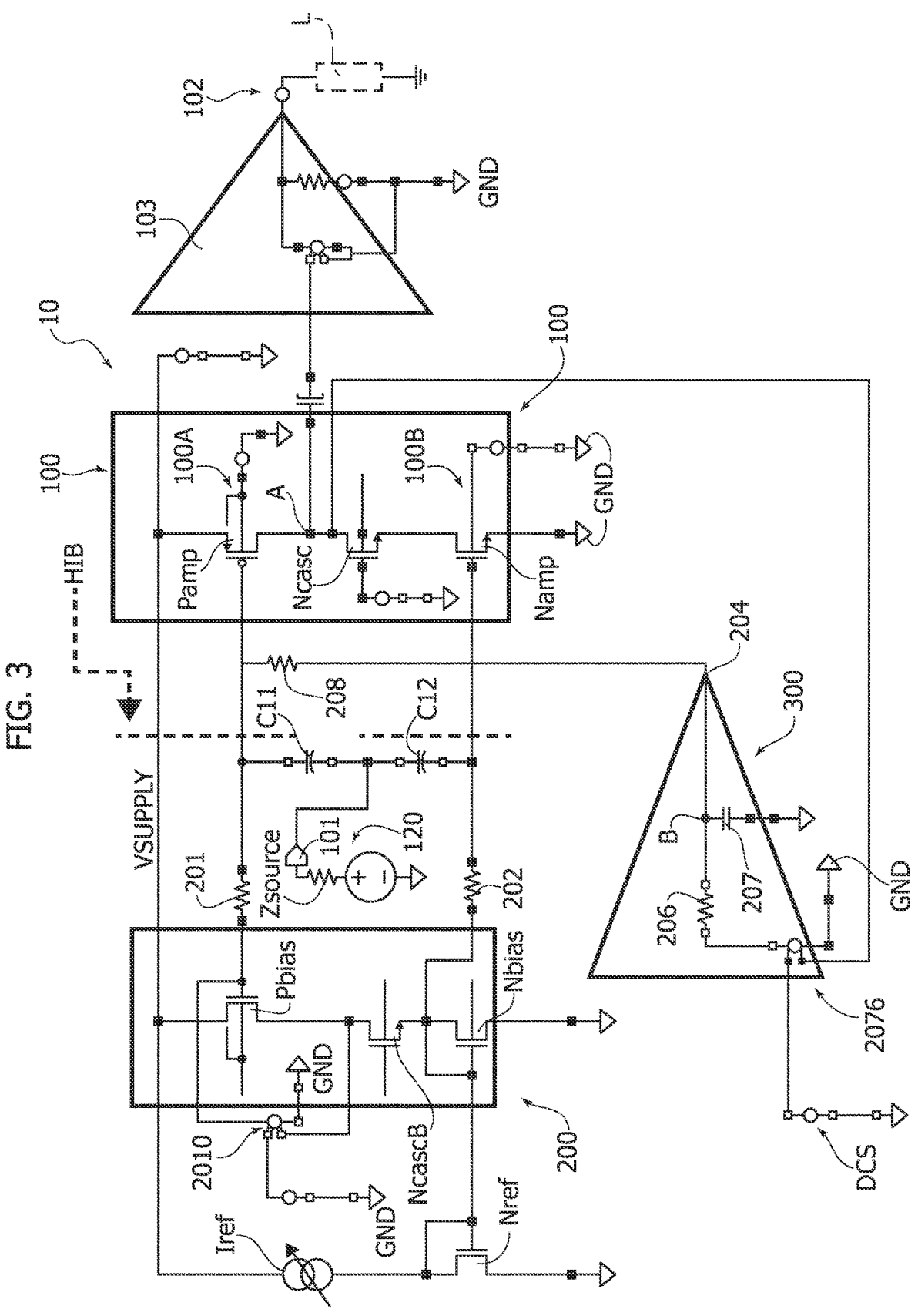
FIG. 3 illustrates a circuit according to a second embodiment of the present description.
Figure 4:
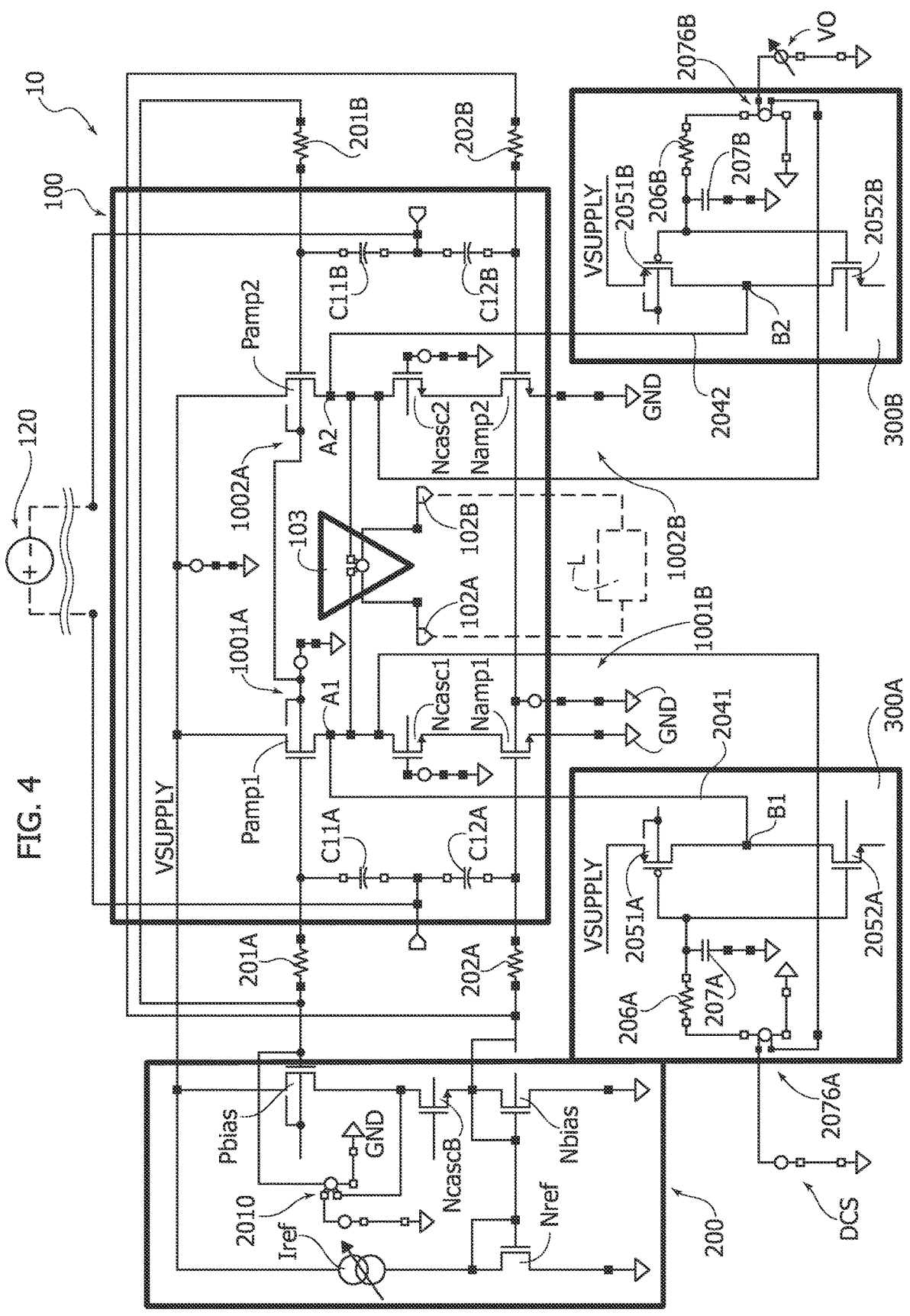
FIG. 4 illustrates a circuit according to a third embodiment of the present description.
Figure 5:
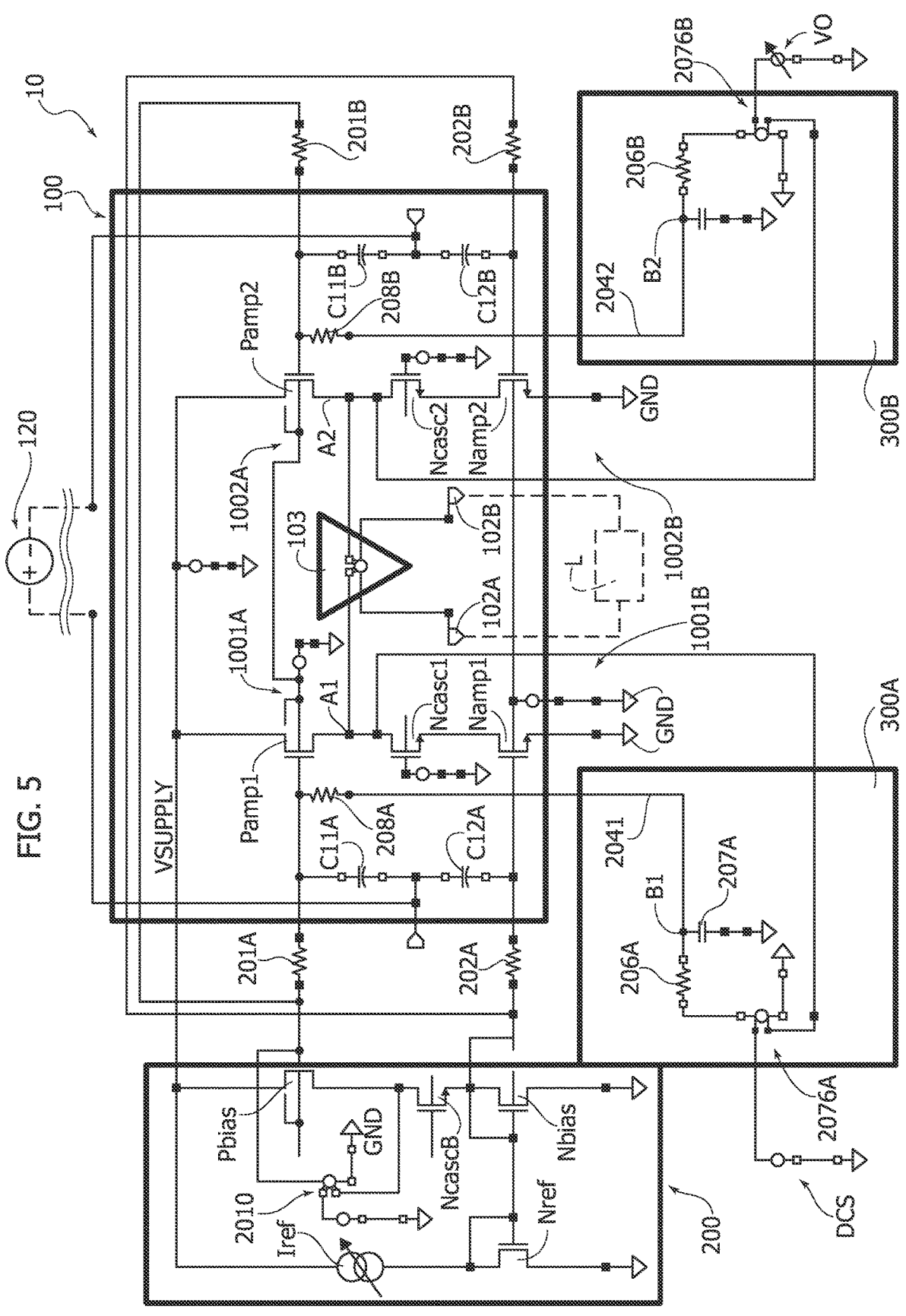
FIG. 5 illustrates a circuit according to a fourth embodiment of the present description.

It is otherwise noted that circuit architecture as illustrated in FIGS. 2 to 5 can be used (e.g., in a maximum gain configuration) even without being coupled to a feedback network as illustrated in FIG. 1. Architecture as illustrated in FIGS. 2 to 5 is built around a "core" amplifier stage 100 having and input port and an output port. As noted, a single-ended layout is illustrated in FIGS. 2 and 3, and a (fully) differential layout is illustrated in FIGS. 4 and 5.

Advantageously, the amplifier 100 has a (very) high output impedance and the output nodes 102 (or 102A, 102B) intended to be coupled to a load L are at a low impedance.

A feedback branch such as the branch Zp in FIG. 1 can be advantageously coupled to the output of a buffer stage 103 to avoid undesired parasitics on the high-impedance node of the amplifier 100. It is otherwise noted that the presence of the buffer stage 103 is not mandatory.

The load L (which, like the source 120, may be a distinct element from the embodiments) is coupled to the output of the amplifier 100 (at the output of the buffer stage 103, for instance) to receive therefrom an output signal, e.g., RF output.

Solutions as described herein are based on a current mirror approach and a DC output closed loop which facilitates achieving an adequate degree of stability in an RF VGA arrangement over the whole (variable) gain range.

FIGS. 2 and 3 illustrate single-ended versions of a solution as described herein built around a main amplifier 100 including a "positive" amplifier (Pamp) 100A, and a "negative" amplifier (Namp) 100B. These can be advantageously implemented using MOSFET transistors, possibly resorting to a cascode arrangement including a main transistor Namp having associated an (optional) cascode transistor Ncasc.

Structure and operation of a cascode arrangement are well known to those of skill in the art, which makes it unnecessary to be provided a more detailed description herein: for that reason, elements of such a cascode arrangement are illustrated but not specifically labelled in the figures.

The positive amplifier 100A (transistor Pamp) and the negative amplifier 100B (transistor Namp, with possibly an associated cascode transistor Ncasc) are arranged with the current flow paths therethrough (source-drain, in the case of a field-effect transistors such as MOSFETs as considered herein) cascaded in a current flow line from a supply node or line VSUPPLY and ground GND.

A node A can provide the output from the amplifier 100 either directly or via the (optional) high-impedance buffer 103. Even if represented as a separate element for clarity of illustration, the buffer 103 may in fact be incorporated to the amplifier 100, so that the node 102 may be regarded as representative of an output node of the amplifier 100, e.g., within the framework of a RF VGA circuit as exemplified in FIG. 1.

The input signal received from the signal source 120 (via the variable impedance branch or branches Zs) can be applied, via a pair of capacitors C11, C12, to the input of the main amplifier 100 as represented by the control terminals (gates, in the case of the field-effect transistor such as MOSFET transistor) of the positive amplifier 100A/Pamp and the negative amplifier 100B (Namp plus, possibly, Ncasc).

Intermediate the positive amplifier 100A/Pamp and the negative amplifier 100B (Namp plus, possibly, Ncasc) a node A is thus present (e.g., between the positive amplifier 100A/Pamp and the cascode transistor Ncasc in the negative amplifier 100B) from which an output signal is available to be applied to the load L, e.g., via the buffer 103.

As otherwise appreciable by those of skill in the art, the circuit diagrams of FIG. 2 to 5 include various (DC) supply sources applied at various nodes/lines in the circuit: for simplicity, most of these supply sources—provided in a manner known to those of skill in the art—are merely represented in the diagrams without being positively labelled and described in order to avoid making the presentation unduly cumbersome.

A supply line VSUPPLY is explicitly illustrated that applies a corresponding voltage to a current mirror loop 200 and a stability loop amplifier 300.

The current mirror loop 200 is used to set a reference current that is suited to be changed via an input current reference source Iref (implemented in any manner known to those of skill in the art).

For instance, the current Iref can be set as the current flowing in a current flow line between the line VSUPPLY and ground GND via a first current mirror transistor Nref (e.g., a field-effect transistors such as a MOSFET transistor in diode-like configuration) with a bias transistor Nbias (this may again be field-effect transistors such as a MOSFET transistor) having its control terminal (namely its gate) connected to the control terminal (again the gate, in the case of a field-effect transistor such as a MOSFET) of the transistor Nref.

The transistor Nbias is arranged with the current flow path therethrough (drain-source in the case of a field-effect transistor such as a MOSFET transistor) forming part of a current flow line from the line VSUPPLY and ground GND. To that effect, the transistor Nbias is cascaded with the current flow-path (once more, drain-source in the case of a field-effect transistor such as a MOSFET transistor) of a further transistor Pbias.

The control terminal (gate, in the case of field-effect transistor such as a MOSFET transistor) of the transistor Pbias is connected to the control terminal (gate, in the case of field-effect transistor such as MOSFET transistor) of the "positive" amplifier 100A/Pamp of the main amplifier 100 via a bias resistor 202, and to a voltage-controlled voltage generator 2010 coupled to the current flow line between the transistors Pbias and Nbias, to an (unlabeled) supply source and to ground GND.

A voltage-controlled voltage generator indicated by reference 2010 can be equaled to an operational amplifier (op-amp) configured to vary the gate voltage of the transistor Pbias to force the drain voltages of the transistors Pbias and Nbias to the same value of the (unlabeled) supply source coupled to the voltage-controlled voltage generator 2010.

The control terminal (gate, in the case of field-effect transistor such as a MOSFET transistor) of the transistor Nbias is connected, via a bias resistor 202, to the control terminal (gate, in the case of field-effect transistor such as MOSFET transistor) of the "negative" amplifier 100A/Pamp of the main amplifier 100.

The current flow line through the transistors Pbias and Nbias may be through a further cascode transistor NCascB, having the current flow path therethrough. In the case of a field-effect transistor, such as a MOSFET transistor, the current flow path is arranged between the current flow-paths through the transistors Pbias and Nbias (source drain current path).

A high-impedance bias is thus "visible" (as denoted by HIB) across the current mirror loop 200. In this specific example, the bias is across the terminals of the bias resistors 201 and 202 opposite to the current mirror loop 200, that is, across the nodes to which the input signal is applied via the capacitors C11, C12). Such a high-impedance bias facilitates resetting the current through the main amplifier core 100 and to "overlap" the RF signal to the positive and negative transistors Pamp and Namp. In that way, the open-loop gain of the amplifier core 100 is made proportional to the sum of the transconductances of the MOSFET transistors Pamp and Namp.

The (optional) cascode transistor Ncasc, arranged therebetween, facilitates increasing the impedance of negative amplifier 100B/Namp, thus increasing the reverse isolation of the amplifier 100.

The circuit diagram of FIG. 2 is a first example of architecture where the stability loop amplifier (stability network) 300 is independent from the open loop and the closed loop gain of the main amplifier 100.

As exemplified in FIG. 2, the stability loop amplifier has an output 204 derived from an intermediate node B between two transistors 205A, 205B, arranged with the current flow paths therethrough (source-drain in the case of a field-effect transistors such as MOSFET transistors) cascaded in a current flow line between the supply line at the voltage VSUPPLY and ground GND.

The two transistors 205A, 205B have their control terminals (gates in the case of a field-effect transistors such as MOSFET transistors) coupled together to low-pass filter comprising a resistor 206 and a capacitor 207, such a low-pass filter being in turn coupled (at the resistor 206, for instance: other ways of coupling can be devised by those of skill in the art) via a further voltage-controlled voltage generator 2076 to the node A in the amplifier 100, to a node DCS that facilitates setting the amplifier DC output voltage plus an (unlabeled) supply source and ground GND.

The output 204 from the stability loop amplifier produced at the node B is applied to the node A that provides (possibly via the optional high-impedance buffer 103) the output of the overall amplifier arrangement shown.

The purpose of the stability loop amplifier 300 is to short-circuit the output of the low-noise amplifier output within its gain bandwidth range thus providing an arrangement exhibiting a high power supply rejection ratio, PSRR.

The description provided in the foregoing applies essentially also to the single-ended variant represented in FIG. 3.

In FIG. 3, part or elements already introduced in connection with FIG. 2 are indicated with like references symbols, so that a corresponding detailed description will not be repeated for brevity.

In the arrangement of FIG. 2, the output 204 (node B) from the stability network 300 is applied to the node A between the positive amplifier 100A/Pamp and the negative amplifier 100B/Namp of the main amplifier 100.

Conversely, in the arrangement of FIG. 3, the output from the node 204 of the stability loop amplifier 300 is applied, via a resistor 208, to the control terminal (gate, in the case of a field-effect transistor such as a MOSFET transistor) of the positive amplifier 100A/Pamp. Also, in the arrangement of FIG. 3, the node B is coupled directly to the output of the RC filter 206, 207 (e.g., the node B may be simply an intermediate node of the RC filter, between the resistor 206 and the capacitor 207).

In that way, in a simplified arrangement as illustrated in FIG. 3, the stability network 300 interacts with the gain network.

As a result, the amplifier closed-loop stability may not be guaranteed for all gain range values, which is acceptable for various applications in the face of the resulting simplification of the circuit.

In connection with the circuit of FIG. 3, it is noted that, in the place of being applied to the input (control terminal) of the positive amplifier 100A/Pamp, the output from the loop amplifier 300 at node 204 could be likewise applied to the control terminal (gate, in the case of a field-effect transistor such as a MOSFET transistor) of the negative amplifier 100B/Namp.

FIG. 4 illustrates a variant of the solution described herein that can be essentially regarded as a differential version of the single-ended version illustrated in FIG. 2. For that reason, the description provided in the foregoing in connection with FIG. 2 also largely applies to FIG. 4.

In the solution of FIG. 4, the main amplifier core 100 adopts a differential structure where the first and the second amplifiers 100A and 100B of FIG. 2 (and FIG. 3) are duplicated in a differential arrangement including two first, positive amplifiers (1001A/Pamp1; 1002A/Pamp2) and two second, negative amplifiers (1001B/Namp1 plus, possibly, Ncasc1 and 1002B/Namp2 plus, possibly, Ncasc2) to drive a (likewise, differential) high-impedance buffer 103 providing a (differential) output—an RF output, for instance—at output nodes 102A, 102B.

A current mirror loop 200 can be provided having essentially the same topology illustrated in FIGS. 2 and 3, with the proviso that, in the exemplary circuit of FIG. 4 the outputs from the transistors Pbias and Nbias are supplied (via resistors 201A, 202A) to the input of the differential amplifier arrangement 1001A, 1001B and 1002A, 1002B.

The structure of a stability loop amplifier 300 as exemplified in FIG. 2 can be duplicated as exemplified in FIG. 4 in the form of two stability loops 300A and 300B having the same structure of the stability loop 300 of FIG. 2: the respective components/elements are designated with the same references appearing in FIG. 2 with suffixes "A" and "B" for the stability loop 300A and for the stability loop 300B, respectively.

The outputs from the two stability loops 300A and 300B, designated 2041 and 2042 (as derived at homologous nodes B1 and B2 in the two stability loops 300A and 300B) are applied to nodes A1 and A2 intermediate the two first, positive amplifiers (1001A/Pamp1; 1002A/Pamp2) and the two second, negative amplifiers (1001B/Namp1 plus, possibly, Ncasc1 and 1002B/Namp2 plus, possibly, Ncasc2).

One of the stability loops 300A, 300B in question, e.g., the loop 300B, may also configured to provide DC offset mismatch recovery as represented by an optional voltage VO. This is useful to optimize IIP2 (second order intercept point: a currently accepted measure of linearity of a system) and even order harmonics behavior.

Essentially the same remarks/description provided in connection with FIG. 4 apply to the alternative differential version illustrated in FIG. 5.

The solution of FIG. 5 can be regarded as a differential version of the solution illustrated in FIG. 3, with the outputs 2041, 2042 from the loop amplifiers 300A, 300B (each having the "simplified" structure described in connection with FIG. 3), applied, via resistors 208A, 208B to the control terminals (gates in the case of field-effect transistors such as MOSFET transistors) of the positive amplifiers 1001A and 1002A.

Here again (as in the case of the circuit of FIG. 3) the outputs 2041, 2042 from the loop amplifiers 300A, 300B can be applied to the control terminals (gates in the case of field-effect transistors such as MOSFET transistors) of the negative amplifiers 1001B and 1002B rather than to the control terminals of the positive amplifiers 1001A and 1002A.

Solutions as described herein increase appreciably the power supply rejection ratio, PSRR, with the possibility of tailoring the related performance for a specific application, for instance, by setting the characteristic of the DC output closed loop independently of the selected value for the RF VGA gain.

Examples as presented herein facilitate a notable increase of the maximum gain (e.g., 6-7 dB from 16-17 dB up to 23 dB and more) in comparison with the conventional approaches as exemplified in FIG. 1.

This facilitates extending the use of low/medium RF VGA architecture in the GHz band (e.g., 2.33 GHz).

Without prejudice to the underlying principles, the details and embodiments may vary, even significantly, with respect to what has been described by way of example only without departing from the extent of protection.

The extent of protection is determined by the annexed claims.

What is claimed is:

1. A circuit, comprising:
an amplifier stage comprising a first positive amplifier branch, a second positive amplifier branch, a first negative amplifier branch, and a second negative amplifier branch, the amplifier stage having current flow paths therethrough cascaded in a first flow line for a first core current for the amplifier stage between a supply node and a ground node, wherein the first positive amplifier branch and the first negative amplifier branch have respective input nodes configured to receive an input signal applied therebetween, and wherein the second positive amplifier branch and the second negative amplifier branch have current flow paths therethrough cascaded in a second flow line for a second core current between the supply node and the ground node; and
a current mirror loop coupled to the respective input nodes of the first positive amplifier branch, the second positive amplifier branch, the first negative amplifier branch, and the second negative amplifier branch, wherein the current mirror loop provides an adjustable high-impedance bias source for the first core current for the amplifier stage.

2. The circuit of claim 1, wherein the amplifier stage further comprises a cascode amplifier branch coupled between the first positive amplifier branch and the first negative amplifier branch.

3. The circuit of claim 1, wherein the current mirror loop comprises:

a bias transistor pair comprising first and second bias transistors having current flow paths therethrough cascaded in a bias current flow line between the supply node and the ground node, the first and second bias transistors having control terminals coupled to the respective input nodes of the first positive amplifier branch and the first negative amplifier branch; and
a diode-connected reference bias transistor having a control terminal coupled in a current mirror arrangement with a control terminal of the second bias transistor.

4. The circuit of claim 1, further comprising a stability network having a gain bandwidth range, the stability network having a first input coupled to an output signal of the amplifier stage and a second input coupled to receive an output voltage setting signal, wherein the amplifier stage is configured to short-circuit the output signal from the amplifier stage within the gain bandwidth range based on the output voltage setting signal.

5. A method of operating the circuit of claim 4, the method comprising:
operating the current mirror loop to provide an adjustable high-impedance bias source for the first core current for the amplifier stage;
receiving an output voltage setting signal by the stability network; and
based on the output voltage setting signal, controlling the amplifier stage to short-circuit an output signal from the amplifier stage within the gain bandwidth range.

6. A variable-gain amplifier, comprising:
the circuit of claim 1;
an input impedance circuit branch; and
a variable-impedance feedback circuit branch;
wherein the respective input nodes of the amplifier stage are configured to receive the input signal applied therebetween via the input impedance circuit branch;
wherein the amplifier stage includes an output node configured to provide an output signal that is a replica of the input signal having a variable gain applied thereto;
wherein the variable-impedance feedback circuit branch is configured to couple the output node to the respective input nodes; and
wherein the gain applied to the input signal is a function of an impedance value of the variable-impedance feedback circuit branch.

7. The variable-gain amplifier of claim 6, wherein the input impedance circuit branch comprises a variable-impedance input impedance network, and wherein the gain applied to the input signal is a function of a ratio of an impedance value of the variable-impedance feedback circuit branch and an impedance value of the variable-impedance input impedance network.

8. A device comprising:
the variable-gain amplifier according to claim 6;
a signal source configured to provide the input signal; and
an electrical load coupled to the output node to receive the output signal.

9. A circuit, comprising:
an amplifier stage comprising a first positive amplifier branch, a second positive amplifier branch, a first negative amplifier branch, and a second negative amplifier branch, the amplifier stage having current flow paths therethrough cascaded in a first flow line for a first core current for the amplifier stage between a supply node and a ground node, wherein the first positive amplifier branch and the first negative amplifier branch have respective input nodes configured to receive an input signal applied therebetween, and wherein the second positive amplifier branch and the second negative amplifier branch have current flow paths therethrough cascaded in a second flow line for a second core current between the supply node and the ground node; and a stability network having a gain bandwidth range, the stability network having a first input coupled to an output signal of the amplifier stage and a second input coupled to receive an output voltage setting signal, wherein the amplifier stage is configured to short-circuit the output signal from the amplifier stage within the gain bandwidth range based on the output voltage setting signal.

10. The circuit of claim 9, wherein the amplifier stage further comprises a cascode amplifier branch coupled between the first positive amplifier branch and the first negative amplifier branch.

11. The circuit of claim 9, wherein the stability network has an output node coupled to a node between the first positive amplifier branch and the first negative amplifier branch in the amplifier stage or to a control node of one of the first positive amplifier branch and the first negative amplifier branch.

12. The circuit of claim 11, wherein the stability network comprises a low-pass filter network that provides the gain bandwidth range and has an output node, wherein the output node of the low-pass filter network is coupled to the node between the first positive amplifier branch and the first negative amplifier branch via a decoupling gain stage or is coupled to the control node of the one of the first positive amplifier branch and the first negative amplifier branch in the amplifier stage.

13. The circuit of claim 11, wherein the amplifier stage further comprises:

a second stability network;

wherein the stability network has an output node coupled to a node between the first positive amplifier branch and the first negative amplifier branch or the control node of the one of the first positive amplifier branch and the first negative amplifier branch; and wherein the second stability network has an output node coupled to a node between the second positive amplifier branch and the second negative amplifier branch or to a control node of one of the second positive amplifier branch and the second negative amplifier branch.

14. A variable-gain amplifier, comprising:

the circuit of claim 9;

an input impedance circuit branch; and a variable-impedance feedback circuit branch;

wherein the respective input nodes of the amplifier stage are configured to receive the input signal applied therebetween via the input impedance circuit branch;

wherein the amplifier stage includes an output node configured to provide the output signal, which is a replica of the input signal having a variable gain applied thereto;

wherein the variable-impedance feedback circuit branch is configured to couple the output node to the respective input nodes; and wherein the gain applied to the input signal is a function of an impedance value of the variable-impedance feedback circuit branch.

15. The variable-gain amplifier of claim 14, wherein the input impedance circuit branch comprises a variable-impedance input impedance network and wherein the gain applied to the input signal is a function of a ratio of an impedance value of the variable-impedance feedback circuit branch and an impedance value of the variable-impedance input impedance network.

16. A device comprising:

the variable-gain amplifier according to claim 14;

a signal source configured to provide the input signal; and an electrical load coupled to the output node to receive the output signal.

17. A method of operating an amplifier circuit that includes an amplifier stage and a current mirror loop, wherein the amplifier stage comprises a first positive amplifier branch, a second positive amplifier branch, a first negative amplifier branch, and a second negative amplifier branch, the first positive amplifier branch and the first negative amplifier branch having current flow paths therethrough cascaded in a first flow line for a first core current for the amplifier stage, the first flow line extending between a supply node and ground node, wherein the second positive amplifier branch and the second negative amplifier branch have current flow paths therethrough cascaded in a second flow line for a second core current between the supply node and the ground node, wherein the first positive amplifier branch and the first negative amplifier branch have respective input nodes configured to receive an input signal applied therebetween, and wherein the current mirror loop is coupled to the respective input nodes of the first positive amplifier branch, the second positive amplifier branch, the first negative amplifier branch, and the second negative amplifier branch, the method comprising:

operating the current mirror loop to provide an adjustable high-impedance bias source for the first core current for the amplifier stage.

18. A method of operating an amplifier circuit that includes an amplifier stage and a stability network having a gain bandwidth range, wherein the amplifier stage comprises a first positive amplifier branch, a second positive amplifier branch, a first negative amplifier branch, and a second negative amplifier branch, the first positive amplifier branch and the second negative amplifier branch having current flow paths therethrough cascaded in a first flow line for a first core current for the amplifier stage, the flow line extending between a supply node and a ground node, wherein the second positive amplifier branch and the second negative amplifier branch have current flow paths therethrough cascaded in a second flow line for a second core current between the supply node and the ground node, wherein the first positive amplifier branch and the first negative amplifier branch have respective input nodes configured to receive an input signal applied therebetween, and wherein the stability network to an output of the amplifier stage, the method comprising:

receiving an output voltage setting signal by the stability network; and based on the output voltage setting signal, controlling the amplifier stage to short-circuit an output signal from the amplifier stage within the gain bandwidth range.

19. The method of claim 18, wherein the stability network comprises a low-pass filter network that provides the gain bandwidth range and has an output node, wherein the output node of the low-pass filter network is coupled to the node between the first positive amplifier branch and the first negative amplifier branch via a decoupling gain stage or is coupled to the control node of one of the first positive amplifier branch and the first negative amplifier branch in the amplifier stage.

20. The method of claim 17, wherein the amplifier circuit further comprises a stability network having a gain bandwidth range, the stability network having a first input coupled to an output signal of the amplifier stage and a second input coupled to receive an output voltage setting signal, wherein the amplifier stage is configured to short-circuit the output signal from the amplifier stage within the gain bandwidth range based on the output voltage setting signal, the method further comprising:

operating the current mirror loop to provide an adjustable high-impedance bias source for the first core current;

receiving an output voltage setting signal by the stability network; and based on the output voltage setting signal, controlling the amplifier stage to short-circuit an output signal from the amplifier stage within the gain bandwidth range.

\* \* \* \* \*